US012709626B2

(12) United States Patent
Hood et al.

(10) Patent No.: US 12,709,626 B2
(45) Date of Patent: Aug. 18, 2026

(54) PRECURSORS FOR SELECTIVE DEPOSITION OF SILICON-CONTAINING FILMS

(71) Applicant: ENTEGRIS, INC., Billerica, MA (US)

(72) Inventors: Drew Michael Hood, Newtown, CT (US); Thomas M. Cameron, Newtown, CT (US); Bryan C. Hendrix, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 18/809,639

(22) Filed: Aug. 20, 2024

(65) Prior Publication Data

US 2025/0074927 A1 Mar. 6, 2025

Related U.S. Application Data

(60) Provisional application No. 63/535,262, filed on Aug. 29, 2023.

(51) Int. Cl.

| | |
|---|---|
| ***C07F 7/02*** | (2006.01) |
| ***C07F 7/18*** | (2006.01) |
| ***C23C 16/40*** | (2006.01) |
| ***C23C 16/455*** | (2006.01) |

(52) U.S. Cl.

CPC ............ *C07F 7/025* (2013.01); *C07F 7/1804* (2013.01); *C07F 7/1896* (2013.01); *C23C 16/402* (2013.01); *C23C 16/45553* (2013.01)

(58) Field of Classification Search

CPC ...... C07F 7/025; C07F 7/1804; C07F 7/1896; C23C 16/402; C23C 16/45553; C23C 16/04

See application file for complete search history.

(56) References Cited

U.S. PATENT DOCUMENTS

2019/0164749 A1 5/2019 Tapily

FOREIGN PATENT DOCUMENTS

| | | | | |
|---|---|---|---|---|
| CN | 102600896 A | | 7/2012 | |
| CN | 104425624 A | | 3/2015 | |
| JP | 2006137842 A | | 6/2006 | |
| WO | WO-2009006272 A1 | * | 1/2009 | ............ C23C 16/42 |
| WO | 2022163450 A1 | | 8/2022 | |

(Continued)

OTHER PUBLICATIONS

Moriones et al., Comprehensive kinetics of hydrolysis of organotriethoxysilanes by 29Si NMR, The Journal of Physical Chemistry A, vol. 123, pp. 10364-10371, 2019.

(Continued)

*Primary Examiner* — Michael G Miller

(57) ABSTRACT

Precursors for selective deposition of silicon-containing films are provided. A precursor comprises a compound of the formula: $R(HO)Si(OR^1)(OR^2)$, where: R is or comprises an alkyl, an alkenyl, or an alkoxy; and $R^1$ and $R^2$ are independently a hydrogen, an alkoxyl, or $R^1$ and $R^2$ are bonded to form a heterocycle. Devices comprising silicon-containing films are also provided, wherein the silicon-containing film comprises a reaction product of the precursor and another reactive species. Methods of depositing silicon-containing films are also provided, among other things.

20 Claims, 2 Drawing Sheets

(56) References Cited

FOREIGN PATENT DOCUMENTS

| | | | |
|---|---|---|---|
| WO | 2022164730 | A1 | 8/2022 |
| WO | 2023069965 | A1 | 4/2023 |
| WO | 2025049165 | A1 | 3/2025 |

OTHER PUBLICATIONS

Perry et al., The Incidence and Fate of Volatile Methyl Siloxanes in a Crewed Spacecraft Cabin, ICES-2017-233, 47th International Conference on Environmental Systems, pp. 1-14, 2017.

* cited by examiner

PRECURSORS FOR SELECTIVE DEPOSITION OF SILICON-CONTAINING FILMS

CROSS-REFERENCE TO RELATED APPLICATIONS

This application claims the benefit under 35 USC 119 of U.S. Provisional Patent Application No. 63/535,262, filed Aug. 29, 2023, the disclosure of which is hereby incorporated herein by reference in its entirety.

FIELD

The present disclosure relates to precursors for selective deposition of silicon-containing films and related devices, related systems, and related methods are provided.

BACKGROUND

Forming films on substrates useful in microelectronic fabrication requires that the films be deposited on certain surfaces. Accordingly, the films are deposited on all surfaces and subsequently removed from certain surfaces. This can involve complex multi-step processes.

SUMMARY

Some embodiments of the present disclosure relate to a precursor. In some embodiments, the precursor comprises a compound of the formula:

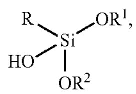

where: R is an alkyl, an alkenyl, or an alkoxy; and $R^1$ and $R^2$ are independently a hydrogen, an alkyl, or $R^1$ and $R^2$ are bonded to form a heterocycle. In some embodiments, the compound, when vaporized to form a precursor vapor, is deposited on a material having a dielectric constant of no greater than 3.9.

Some embodiments relate to a device. In some embodiments, the device comprises a substrate having a first surface portion and a second surface portion. In some embodiments, the device comprises a silicon-containing film located on the first surface portion of the substrate. In some embodiments, the silicon-containing film comprises a reaction product of at least a precursor and a reactive group on the first surface portion of the substrate. In some embodiments, the precursor comprises a compound of the formula:

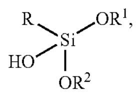

where: R is an alkyl, an alkenyl, or an alkoxy; and $R^1$ and $R^2$ are independently a hydrogen, an alkyl, or $R^1$ and $R^2$ are bonded to form a heterocycle. In some embodiments, the second surface portion of the substrate does not comprise the silicon-containing film.

Some embodiments relate to a method for depositing a silicon-containing film. In some embodiments, the method comprises obtaining a precursor. In some embodiments, the precursor is a compound of the formula:

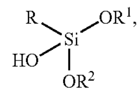

where: R is an alkyl, an alkenyl, or an alkoxy; and $R^1$ and $R^2$ are independently a hydrogen, an alkyl, or $R^1$ and $R^2$ are bonded to form a heterocycle. In some embodiments, the method comprises vaporizing the precursor to produce a vaporized precursor. In some embodiments, the method comprises exposing a substrate to the vaporized precursor in a presence of a catalyst to selectively deposit a silicon-containing film on the substrate.

BRIEF DESCRIPTION OF DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
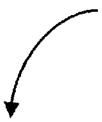
FIG. 1 is a schematic diagram of a cross-sectional view of a silicon-containing film deposited on a substrate, according to some embodiments.
Figure 1:
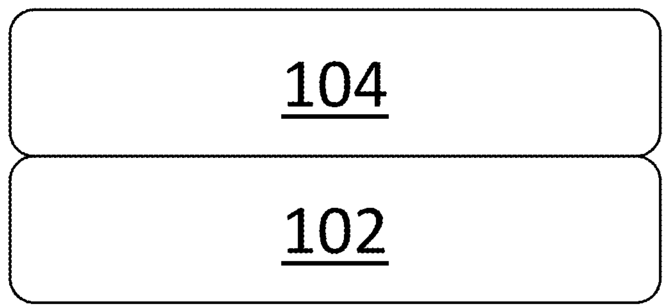

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though they may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "alkyl" refers to a hydrocarbon compound having from 1 to 30 carbon atoms. An alkyl having n carbon atoms may be designated as a "$C_n$ alkyl." For example, a "$C_3$ alkyl" may include n-propyl and iso-propyl. An alkyl having a range of carbon atoms, such as 1 to 30 carbon atoms, may be designated as a $C_1$-$C_{30}$ alkyl. In some embodiments, the alkyl is linear. In some embodiments, the alkyl is branched. In some embodiments, the alkyl is substituted. In some embodiments, the alkyl is unsubstituted. In some embodiments, the alkyl comprises or is selected from the group consisting of at least one of a $C_1$-$C_{10}$ alkyl, a $C_1$-$C_9$ alkyl, a $C_1$-$C_8$ alkyl, a $C_1$-$C_7$ alkyl, a $C_1$-$C_6$ alkyl, a $C_1$-$C_5$ alkyl, a $C_1$-$C_4$ alkyl, a $C_1$-$C_3$ alkyl, a $C_2$-$C_{10}$ alkyl, a $C_3$-$C_{10}$ alkyl, a $C_4$-$C_{10}$ alkyl, a $C_5$-$C_{10}$ alkyl, a $C_6$-$C_{10}$ alkyl, a $C_7$-$C_{10}$ alkyl, a $C_8$-$C_{10}$ alkyl, a $C_2$-$C_9$ alkyl, a $C_2$-$C_8$ alkyl, a $C_2$-$C_7$ alkyl, a $C_2$-$C_6$ alkyl, a $C_2$-$C_5$ alkyl, a $C_3$-$C_5$ alkyl, or any combination thereof. In some embodiments, the alkyl comprises or is selected from the group consisting of at least one of methyl, ethyl, n-propyl, 1-methylethyl (iso-propyl), n-butyl, iso-butyl, sec-butyl, n-pentyl, 1,1-dimethylethyl (tert-butyl), n-pentyl, iso-pentyl, tert-pentyl, n-hexyl, isohexyl, 3-methylhexyl, 2-methylhexyl, heptyl, octyl, nonyl, decyl, dodecyl, octadecyl, or any combination thereof.

As used herein, the term "alkenyl" refers to a hydrocarbon chain radical having from 1 to 10 carbon atoms and at least one carbon-carbon double bond. Examples of alkenyl groups include, without limitation, at least one of vinyl, allyl, 1-methylvinyl, 1-propenyl, 1-butenyl, 2-butenyl, 3-butenyl, 1,3-butadienyl, 2-methyl-1-propenyl, 2-methyl-2-propenyl, 1-pentenyl, 2-pentenyl, 3-pentenyl, 4-pentenyl, 1,3-pentadienyl, 2,4-pentadienyl, 1,4-pentadienyl, 3-methyl-2-butenyl, 1-hexenyl, 2-hexenyl, 3-hexenyl, 1,3-hexadienyl, 1,4-hexadienyl, 2-methylpentenyl, 1-heptenyl, 3-heptenyl, 1-octenyl, 1,3-octadienyl, 1-nonenyl, 2-nonenyl, 3-nonenyl, 1-decenyl, 3-decenyl, 1-undecenyl, oleyl, linoleyl, linolenyl, or any combination thereof.

As used herein, the term "alkoxy" refers to a radical of formula —OR, wherein R is an alkyl, as defined herein. In some embodiments, the alkoxy may comprise, consist of, or consist essentially of, or may selected from the group consisting of, at least one of methoxy, ethoxy, methoxy, ethoxy, n-propoxy, 1-methylethoxy (isopropoxy), n-butoxy, iso-butoxy, sec-butoxy, tert-butoxy, tert-pentoxy, or any combination thereof.

As used herein, the term "allyl" refers to $—CH_2CH═CH_2$.

As used herein, the term "vinyl" refers to $—CH═CH_2$.

As used herein, the term "silicon-containing film" refers to a film comprising at least one of silicon, silicon nitride, silicon oxynitride, silicon oxide, silicon dioxide, silicon carbide, silicon carbonitride, silicon oxycarbonitride, carbon-doped silicon nitride, carbon-doped silicon oxide, carbon-doped silicon oxynitride, or any combination thereof. For example, the silicon-containing film may comprise at least one of a SiO film, a $SiO_2$ film, a SiN film, a SiOC film, a SiOCH film, a SiCN film, a SiOCN film, or any combination thereof. In some embodiments, the silicon-containing film has a thickness of 20 Å to 2000 Å.

Some embodiments relate to precursors and related methods. At least some of these embodiments relate to precursors useful in the fabrication of microelectronic devices, including semiconductor devices, and the like. For example, the precursors can be used to form silicon-containing films by one or more deposition processes. Examples of deposition processes include, without limitation, at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a rapid atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

The precursors disclosed herein may be useful for selective deposition of films on substrates. In some embodiments, the term "selective deposition" or "selectively depositing" comprises a process in which more of a substance is deposited on a first material than a second material, wherein the first material and the second material are different. In some embodiments, the precursors are useful for depositing a film on a first material with a selectivity over a second material, wherein the second material is different from the first material. In some embodiments, the first material is a dielectric material. In some embodiments, the first material is an insulating material. In some embodiments, selectively depositing a film on a first material is a process in which the film is not or is not substantially deposited on the second material. In some embodiments, the precursors are selectively deposited, over a range of thicknesses, on the first surface portion of the substrate (e.g., low dielectric constant material, etc.), and not on the second surface portion of the substrate (e.g., comprising metal, etc.). In some embodiments, the deposited films are films having low dielectric constants.

The precursors may also provide improved control over at least one of film thickness, film conformity, deposition rate, or any combination thereof. In some embodiments, the precursors exhibit a decreased rate of hydrolysis relative to conventional precursors, such as, for example and without limitation tris-(tert-pentoxy) silanol. In some embodiments, the precursors exhibit a reduced rate of crosslinking. In some embodiments, the rate of diffusion is the rate determining step for film growth, as opposed to the rate of crosslinking. In some embodiments, when the rate of diffusion is the rate determining step for film growth, the film thickness is controlled and/or proportional to the concentration of the precursor.

Some embodiments relate to a precursor. The precursor may comprise a compound of the formula:

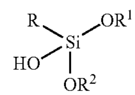

where:

R is or comprises at least one of an alkyl, an alkenyl, an alkoxy, or any combination thereof;

$R^1$ and $R^2$ are independently a hydrogen, an alkyl, or $R^1$ and $R^2$ are bonded to form a heterocycle.

In some embodiments, R is different from at least one of $OR^1$, $OR^2$, or any combination thereof. In some embodiments, at least one of R, $OR^1$, $OR^2$, or any combination thereof, is not a tert-pentoxy.

In some embodiments, the precursor comprises a compound of at least one of the following formulas:

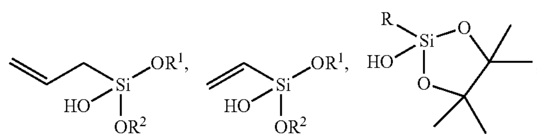

or any combination thereof, where:

R is or comprises at least one of an alkyl, an alkenyl, an alkoxy, or any combination thereof;

$R^1$ and $R^2$ are independently a hydrogen, an alkyl, or $R^1$ and $R^2$ are bonded to form a heterocycle.

In some embodiments, the precursor comprises a compound of at least one of the following formulas:

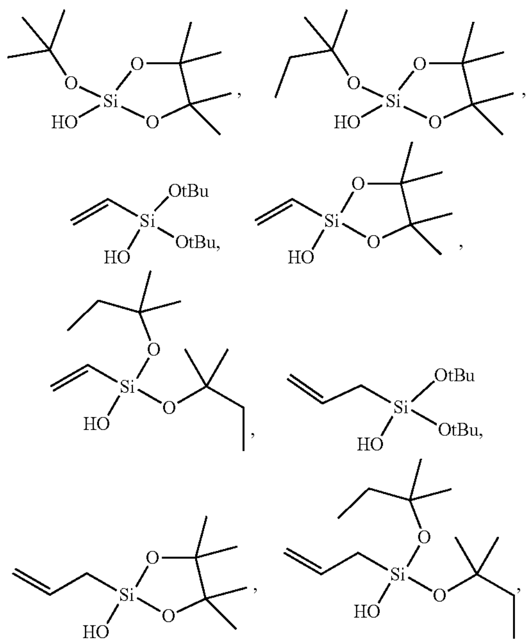

or any combination thereof.

In some embodiments, R is or comprises an alkyl. In some embodiments, R is or comprises an alkenyl. In some embodiments, R is or comprises an alkoxy. In some embodiments, $R^1$ is or comprises a hydrogen. In some embodiments, $R^1$ is or comprises an alkyl. In some embodiments, $R^2$ is or comprises a hydrogen. In some embodiments, $R^2$ is or comprises an alkyl. In some embodiments, $R^1$ and $R^2$ are bonded to form a heterocycle. In some embodiments, the heterocycle is a 5-membered heterocycle. In some embodiments, the heterocycle is a 6-membered heterocycle. In some embodiments, the heterocycle is a 7-membered heterocycle. In some embodiments, the heterocycle is an 8-membered heterocycle. In some embodiments, the heterocycle is a 9-membered heterocycle. In some embodiments, the heterocycle is a 10-membered heterocycle. In some embodiments, $R^1$ and $R^2$ are same. In some embodiments, $R^1$ and $R^2$ are different.

In some embodiments, the compound, when vaporized to form a precursor, is deposited on a material having a dielectric constant of no greater than 3.9, no greater than 3.8, no greater than 3.7, no greater than 3.6, no greater than 3.5, no greater than 3.4, no greater than 3.3, no greater than 3.2, no greater than 3.1, no greater than 3, no greater than 2.9, no greater than 2.8, no greater than 2.7, no greater than 2.6, no greater than 2.5, no greater than 2.4, no greater than 2.3, no greater than 2.2, no greater than 2.1, no greater than 2, no greater than 1.9, no greater than 1.8, no greater than 1.7, no greater than 1.6, no greater than 1.5, no greater than 1.4, no greater than 1.3, no greater than 1.2, no greater than 1, no greater than 0.9, no greater than 0.8, no greater than 0.7, no greater than 0.6, no greater than 0.5, no greater than 0.4, no greater than 0.3, no greater than 0.2, or no greater than 0.1 In some embodiments, the film is selectively deposited on a low dielectric constant, or low-k, material. In some embodiments, the compound, when vaporized to form a precursor, is deposited on a material having a dielectric constant of 0.1 to 3.9, or any range or subrange between 0.1 and 3.9. In some embodiments, the compound, when vaporized to form a precursor vapor, is not deposited on surfaces comprising a material having a dielectric constant of greater than 3.9.

In some embodiments, the compound, when vaporized to form a precursor, is deposited on a material having a dielectric constant of 0.1 to 3.9, or any range or subrange between 0.1 and 3.9. In some embodiments, the compound, when vaporized to form a precursor, is deposited on a material having a dielectric constant of 0.1 to 3.8, 0.1 to 3.7, 0.1 to 3.6, 0.1 to 3.5, 0.1 to 3.4, 0.1 to 3.3, 0.1 to 3.2, 0.1 to 3.1, 0.1 to 3, 0.1 to 2.9, 0.1 to 2.8, 0.1 to 2.7, 0.1 to 2.6, 0.1 to 2.5, 0.1 to 2.4, 0.1 to 2.3, 0.1 to 2.2, 0.1 to 2.1, 0.1 to 2, 0.1 to 1.9, 0.1 to 1.8, 0.1 to 1.7, 0.1 to 1.6, 0.1 to 1.5, 0.1 to 1.4, 0.1 to 1.3, 0.1 to 1.2, 0.1 to 1.1, 0.1 to 1, 0.1 to 0.9, 0.1 to 0.8, 0.1 to 0.7, 0.1 to 0.6, 0.1 to 0.5, 0.1 to 0.4, 0.1 to 0.3, or 0.1 to 0.2. In some embodiments, the compound, when vaporized to form a precursor, is deposited on a material having a dielectric constant of 0.2 to 3.9, 0.3 to 3.9, 0.4 to 3.9, 0.5 to 3.9, 0.6 to 3.9, 0.7 to 3.9, 0.8 to 3.9, 0.9 to 3.9, 1 to 3.9, 1.1 to 3.9, 1.2 to 3.9, 1.3 to 3.9, 1.4 to 3.9, 1.5 to 3.9, 1.6 to 3.9, 1.7 to 3.9, 1.8 to 3.9, 1.9 to 3.9, 2 to 3.9, 2.1 to 3.9, 2.2 to 3.9, 2.3 to 3.9, 2.4 to 3.9, 2.5 to 3.9, 2.6 to 3.9, 2.7 to 3.9, 2.8 to 3.9, 2.9 to 3.9, 3 to 3.9, 3.1 to 3.9, 3.2 to 3.9, 3.3 to 3.9, 3.4 to 3.9, 3.5 to 3.9, 3.6 to 3.9, 3.7 to 3.9, or 3.8 to 3.9.

In some embodiments, the precursor has a purity of at least 90%, at least 95%, at least 99%, at least 99.9%, at least 99.99%, at least 99.999%, at least 99.9999% to 100%, or any range or subrange between 90% and 100%.

Some embodiments relate to a device. In some embodiments, for example, the device is a fully self-aligned via, among other devices, which may have recessed features. The device may comprise a substrate. The substrate may have a first surface portion and a second surface portion, wherein the first surface portion is different from the second surface portion. In some embodiments, the first surface portion and the second surface portion are constructed of different materials. In some embodiments, the first surface portion is adjacent to the second surface portion. In some embodiments, the first surface portion abuts the second surface portion. In some embodiments, an intervening surface portion is located between the first surface portion and the second surface portion. In some embodiments, the first surface portion and the second surface portion are constructed of materials with different dielectric constants. In some embodiments, the first surface portion is constructed of a material having a dielectric constant of no greater than 3.9. In some embodiments, the first surface portion is constructed of a material having a dielectric constant of 0.1 to 3.9.

The substrate may comprise at least one of a dielectric material, an insulating material, a conducting material, or any combination thereof. In some embodiments, the first surface portion of the substrate is constructed of or comprises at least one of a dielectric material, an insulating material, or any combination thereof. In some embodiments, the second surface portion of the substrate comprises a conducting material (e.g., an electrically conducting material). In some embodiments, the second surface portion of the substrate is constructed of or comprises a metal-containing material (e.g., one or more metals). In some embodiments, the substrate comprises at least one of Si, Co, Cu, Al, W, WN, WC, TiN, Mo, MoC, $SiO_2$, SiOC, Ge, SiN, WCN, $Al_2O_3$, AlN, $ZrO_2$, $La_2O_3$, TaN, $RuO_2$, $IrO_2$, $Nb_2O_3$, $Y_2O_3$, hafnium oxide, or any combination thereof. In some embodiments, the substrate may comprise other silicon-based substrates, such as, for example, one or more of polysilicon substrates, metallic substrates, and dielectric substrates.

The device may comprise a silicon-containing film located on the first surface portion of the substrate. In some embodiments, the silicon-containing film is a reaction product of at least a precursor and a reactive group on the first surface portion of the substrate. In some embodiments, the precursor comprises a compound of the formula:

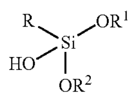

where:

R is or comprises at least one of an alkyl, an alkenyl, an alkoxy, or any combination thereof;

$R^1$ and $R^2$ are independently a hydrogen, an alkyl, or $R^1$ and $R^2$ are bonded to form a heterocycle. In some embodiments, the reactive group on the first surface portion of the substrate is native to the substrate. In some embodiments, the reactive group is a functional group added to the substrate and/or the first surface portion of the substrate. In some embodiments, the reactive group comprises the reacted precursor, wherein the reacted precursor is attached to the surface of the substrate.

In some embodiments, the precursor comprises a compound of at least one of the following formulas:

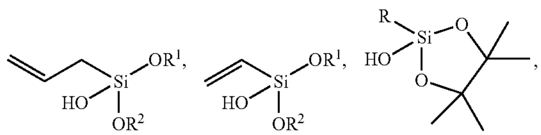

or any combination thereof, where:

$R^1$ and $R^2$ are independently a hydrogen, an alkyl, or $R^1$ and $R^2$ are bonded to form a heterocycle.

In some embodiments, the precursor comprises a compound of at least one of the following formulas:

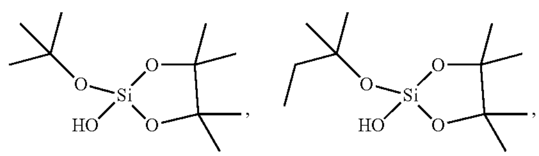

-continued

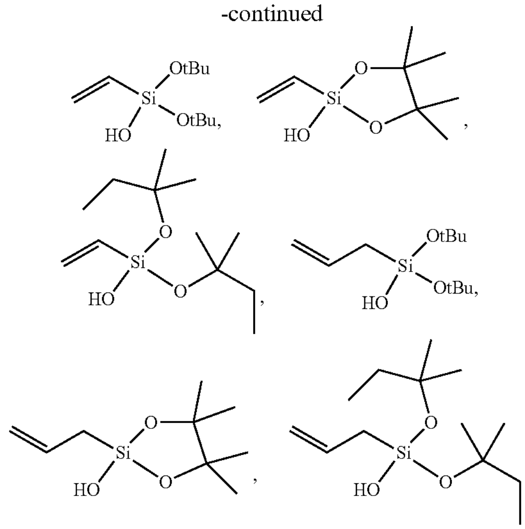

or any combination thereof.

In some embodiments, R is or comprises an alkyl. In some embodiments, R is or comprises an alkenyl. In some embodiments, R is or comprises an alkoxy. In some embodiments, $R^1$ is or comprises a hydrogen. In some embodiments, $R^1$ is or comprises an alkyl. In some embodiments, $R^2$ is or comprises a hydrogen. In some embodiments, $R^2$ is or comprises an alkyl. In some embodiments, $R^1$ and $R^2$ are bonded to form a heterocycle. In some embodiments, the heterocycle is a 5-membered heterocycle. In some embodiments, the heterocycle is a 6-membered heterocycle. In some embodiments, the heterocycle is a 7-membered heterocycle. In some embodiments, the heterocycle is an 8-membered heterocycle. In some embodiments, the heterocycle is a 9-membered heterocycle. In some embodiments, the heterocycle is a 10-membered heterocycle. In some embodiments, $R^1$ and $R^2$ are same. In some embodiments, $R^1$ and $R^2$ are different.

The silicon-containing film is located on the first surface portion of the substrate. In some embodiments, the first surface portion of the substrate comprises at least one of a dielectric material, an insulating material, or any combination thereof. In some embodiments, the first surface portion of the substrate comprises at least one of $SiO_2$, SiN, or any combination thereof. In some embodiments, the first surface portion of the substrate is constructed of or comprises a material having a dielectric constant of no greater than 3.9, no greater than 3.8, no greater than 3.7, no greater than 3.6, no greater than 3.5, no greater than 3.4, no greater than 3.3, no greater than 3.2, no greater than 3.1, no greater than 3, no greater than 2.9, no greater than 2.8, no greater than 2.7, no greater than 2.6, no greater than 2.5, no greater than 2.4, no greater than 2.3, no greater than 2.2, no greater than 2.1, no greater than 2, no greater than 1.9, no greater than 1.8, no greater than 1.7, no greater than 1.6, no greater than 1.5, no greater than 1.4, no greater than 1.3, no greater than 1.2, no greater than 1, no greater than 0.9, no greater than 0.8, no greater than 0.7, no greater than 0.6, no greater than 0.5, no greater than 0.4, no greater than 0.3, no greater than 0.2, or no greater than 0.1.

In some embodiments, the first surface portion of the substrate is constructed of or comprises a material having a dielectric constant of 0.1 to 3.9, or any range or subrange between 0.1 and 3.9. In some embodiments, the first surface portion of the substrate is constructed of or comprises a material having a dielectric constant of 0.1 to 3.8, 0.1 to 3.7, 0.1 to 3.6, 0.1 to 3.5, 0.1 to 3.4, 0.1 to 3.3, 0.1 to 3.2, 0.1 to 3.1, 0.1 to 3, 0.1 to 2.9, 0.1 to 2.8, 0.1 to 2.7, 0.1 to 2.6, 0.1 to 2.5, 0.1 to 2.4, 0.1 to 2.3, 0.1 to 2.2, 0.1 to 2.1, 0.1 to 2, 0.1 to 1.9, 0.1 to 1.8, 0.1 to 1.7, 0.1 to 1.6, 0.1 to 1.5, 0.1 to 1.4, 0.1 to 1.3, 0.1 to 1.2, 0.1 to 1.1, 0.1 to 1, 0.1 to 0.9, 0.1 to 0.8, 0.1 to 0.7, 0.1 to 0.6, 0.1 to 0.5, 0.1 to 0.4, 0.1 to 0.3, or 0.1 to 0.2. In some embodiments, the first surface portion of the substrate is constructed of or comprises a material having a dielectric constant of 0.2 to 3.9, 0.3 to 3.9, 0.4 to 3.9, 0.5 to 3.9, 0.6 to 3.9, 0.7 to 3.9, 0.8 to 3.9, 0.9 to 3.9, 1 to 3.9, 1.1 to 3.9, 1.2 to 3.9, 1.3 to 3.9, 1.4 to 3.9, 1.5 to 3.9, 1.6 to 3.9, 1.7 to 3.9, 1.8 to 3.9, 1.9 to 3.9, 2 to 3.9, 2.1 to 3.9, 2.2 to 3.9, 2.3 to 3.9, 2.4 to 3.9, 2.5 to 3.9, 2.6 to 3.9, 2.7 to 3.9, 2.8 to 3.9, 2.9 to 3.9, 3 to 3.9, 3.1 to 3.9, 3.2 to 3.9, 3.3 to 3.9, 3.4 to 3.9, 3.5 to 3.9, 3.6 to 3.9, 3.7 to 3.9, or 3.8 to 3.9.

In some embodiments, the second surface portion of the substrate does not comprise the silicon-containing film. In some embodiments, the second surface portion of the substrate is constructed of or comprises a material having a dielectric constant of greater than 3.9. For example, in some embodiments, the second surface portion of the substrate is constructed of or comprises a material having a dielectric constant of 4 or greater. In some embodiments, the second surface portion of the substrate is constructed of or comprises a metal.

The silicon-containing film may have a thickness of 100 Å to 100 μm, or any range or subrange between 100 Å to 100 μm. In some embodiments, the silicon-containing film has a thickness of 0.1 μm to 100 μm, 1 μm to 100 μm, 10 μm to 100 μm, 20 μm to 100 μm, 30 μm to 100 μm, 40 μm to 100 μm, 50 μm to 100 μm, 60 μm to 100 μm, 70 μm to 100 μm, 80 μm to 100 μm, or 90 μm to 100 μm. In some embodiments, the silicon-containing film has a thickness of 20 Å to 90 μm, 20 Å to 80 μm, 20 Å to 70 μm, 20 Å to 60 μm, 20 Å to 50 μm, 20 Å to 40 μm, 20 Å to 30 μm, 20 Å to 20 μm, 20 Å to 10 μm, 20 Å to 1 μm, or 20 Å to 0.1 μm. In some embodiments, the silicon-containing film has a thickness of 20 Å to 900 Å, 20 Å to 800 Å, 20 Å to 700 Å, 20 Å to 600 Å, 20 Å to 500 Å, 20 Å to 400 Å, 20 Å to 300 Å, 20 Å to 200 Å, 200 Å to 900 Å, 300 Å to 900 Å, 400 Å to 900 Å, 500 Å to 900 Å, 600 Å to 900 Å, 700 Å to 900 Å, or 800 Å to 900 Å. In some embodiments, the thicknesses above refer to an average thickness of the silicon-containing film.

FIG. 1 is a schematic diagram of a cross-sectional view of a silicon-containing film deposited on a substrate, according to some embodiments. As shown in FIG. 1, a substrate 102 comprises a silicon-containing film 104 deposited on a surface of the substrate 102. Any of the silicon-containing films and/or substrates disclosed herein may be used without departing from the scope of this disclosure.

Figure 2:
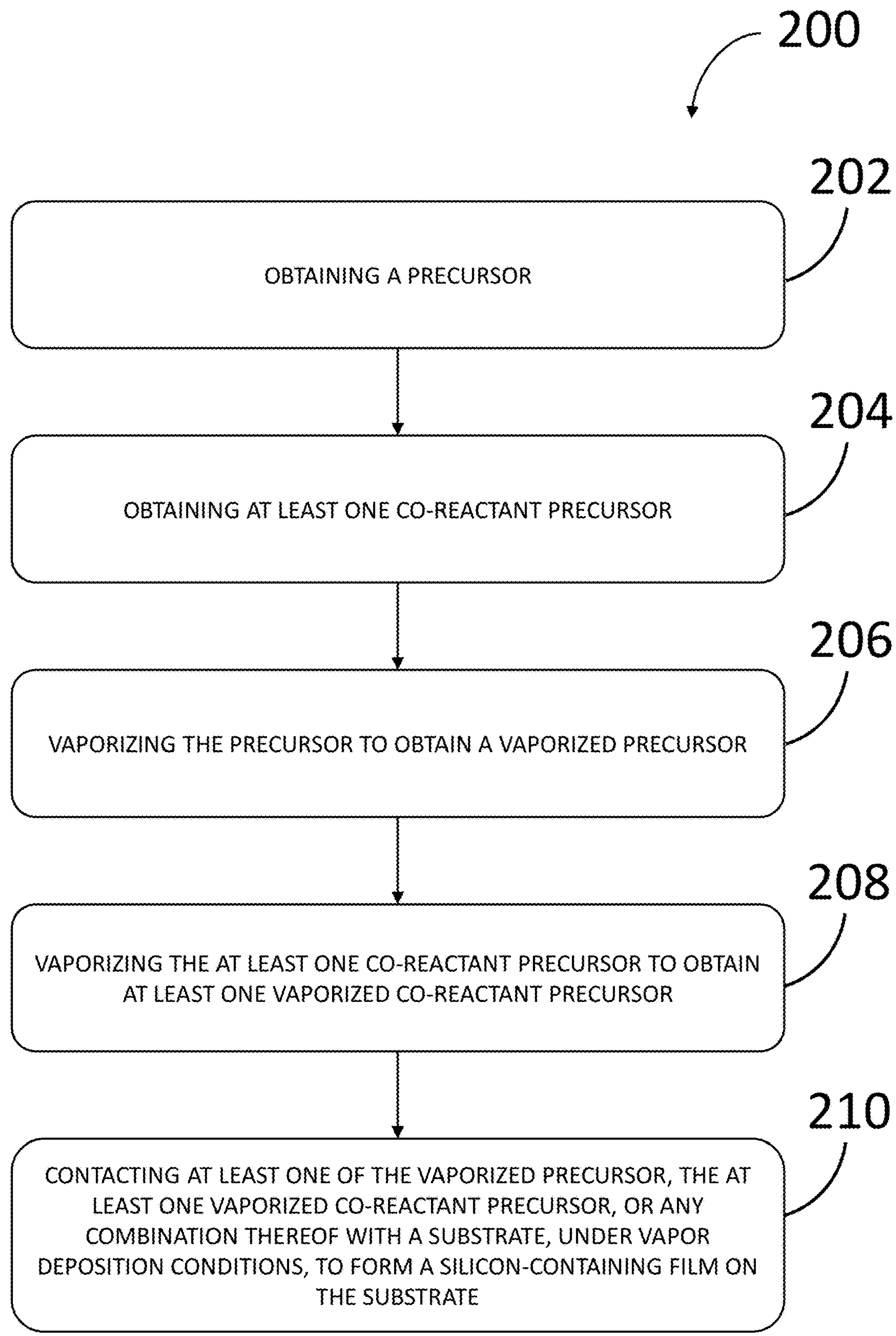
FIG. 2 is a flowchart of a method for depositing a silicon-containing film, according to some embodiments.

FIG. 2 is a flowchart of a method for making a silicon-containing film 200, according to some embodiments. As shown in FIG. 2, the method for making a silicon-containing film 200 comprises one or more of the following steps: obtaining 202 a precursor, obtaining 204 at least one co-reactant precursor, vaporizing 206 the precursor to obtain a vaporized precursor, vaporizing 208 the at least one co-reactant precursor to obtain at least one vaporized co-reactant precursor, and exposing 210 a substrate, under vapor deposition conditions, to at least one of the vaporized precursor, the at least one vaporized co-reactant precursor, or any combination thereof, to selectively deposit a silicon-containing film on the substrate. In some embodiments, the method does not comprise an etching step (e.g., selective etching step(s)). In some embodiments, the method further comprises selecting or adjusting a concentration of the precursor in a vapor to control a thickness of the silicon-containing film.

The step 202 may comprise, consist of, or consist essentially of obtaining a precursor. The precursor may comprise, consist of, or consist essentially of any one or more of the precursors disclosed herein. The obtaining may comprise obtaining a container or other vessel comprising the precursor. In some embodiments, the precursor may be obtained in a container or other vessel in which the precursor is to be vaporized.

The step 204 may comprise, consist of, or consist essentially of obtaining at least one co-reactant precursor. In some embodiments, the at least one co-reactant precursor comprises, consists of, or consists essentially of, or is selected from the group consisting of, at least one of an oxidizing gas, a reducing gas, a hydrocarbon, or any combination thereof. The at least one co-reactant precursor may be selected to obtain a desired silicon-containing film. In some embodiments, the at least one co-reactant precursor may comprise, consist of, or consist essentially of at least one of $N_2$, $H_2$, $NH_3$, $N_2H_4$, $CH_3HNNH_2$, $CH_3HNNHCH_3$, $NCH_3H_2$, $NCH_3CH_2H_2$, $N(CH_3)_2H$, $N(CH_3CH_2)_2H$, $N(CH_3)_3$, $N(CH_3CH_2)_3$, $Si(CH_3)_2NH$, pyrazoline, pyridine, ethylene diamine, a radical thereof, or any combination thereof. In some embodiments, the at least one co-reactant precursor may comprise, consist of, or consist essentially of at least one of $H_2$, $O_2$, $O_3$, $H_2O$, $H_2O_2$, NO, $N_2O$, $NO_2$, CO, $CO_2$, a carboxylic acid, an alcohol, a diol, a radical thereof, or any combination thereof. In some embodiments, the at least one co-reactant precursor comprise, consist of, or consist essentially of at least one of methane, ethane, ethylene, acetylene, or any combination thereof. The obtaining may comprise obtaining a container or other vessel comprising the at least one co-reactant precursor. In some embodiments, the at least one co-reactant precursor may be obtained in a container or other vessel in which the at least one co-reactant precursor is to be vaporized. In some embodiments, the method further comprises an inert gas, such as, for example, at least one of argon, helium, nitrogen, or any combination thereof.

The step 206 may comprise, consist of, or consist essentially of vaporizing the precursor to obtain a vaporized precursor. The vaporizing may comprise, consist of, or consist essentially of heating the precursor sufficient to obtain the vaporized precursor. In some embodiments, the vaporizing may comprise, consist of, or consist essentially of heating a container comprising the precursor. In some embodiments, the vaporizing may comprise, consist of, or consist essentially of heating the precursor in a deposition chamber in which the vapor deposition process is performed. In some embodiments, the vaporizing may comprise, consist of, or consist essentially of heating a conduit for delivering the precursor, vaporized precursor, or any combination thereof to, for example, a deposition chamber. In some embodiments, the vaporizing may comprise, consist of, or consist essentially of operating a vapor delivery system comprising the precursor. In some embodiments, the vaporizing may comprise, consist of, or consist essentially of heating to a temperature sufficient to vaporize the precursor to obtain the vaporized precursor. In some embodiments, the vaporizing may comprise, consist of, or consist essentially of heating to a temperature below a decomposition temperature of at least one of the precursor, the vaporized precursor, or any combination thereof. In some embodiments, the precursor may be present in a gas phase, in which case the step 206 is optional and not required. For example, the precursor may comprise, consist of, or consist essentially of the vaporized precursor.

The step 208 may comprise, consist of, or consist essentially of vaporizing the at least one co-reactant precursor to obtain the at least one vaporized co-reactant precursor. In some embodiments, the vaporizing may comprise, consist of, or consist essentially of heating the at least one co-reactant precursor sufficient to obtain the at least one vaporized co-reactant precursor. In some embodiments, the vaporizing may comprise, consist of, or consist essentially of heating a container comprising the at least one co-reactant precursor. In some embodiments, the vaporizing may comprise, consist of, or consist essentially of heating the at least one co-reactant precursor in a deposition chamber in which the vapor deposition process is performed. In some embodiments, the vaporizing may comprise, consist of, or consist essentially of heating a conduit for delivering the at least one co-reactant precursor, the at least one vaporized co-reactant precursor, or any combination thereof to, for example, a deposition chamber. In some embodiments, the vaporizing may comprise, consist of, or consist essentially of operating a vapor delivery system comprising the at least one co-reactant precursor. In some embodiments, the vaporizing may comprise, consist of, or consist essentially of heating to a temperature sufficient to vaporize the at least one co-reactant precursor to obtain the at least one vaporized co-reactant precursor. In some embodiments, the vaporizing may comprise, consist of, or consist essentially of heating to a temperature below a decomposition temperature of at least one of the at least one co-reactant precursor, the at least one vaporized co-reactant precursor, or any combination thereof. In some embodiments, the at least one co-reactant precursor may be present in a gas phase, in which case the step 208 is optional and not required. For example, the at least one co-reactant precursor may comprise, consist of, or consist essentially of the at least one vaporized co-reactant precursor.

The step 210 may comprise, consist of, or consist essentially of exposing 210 a substrate, under vapor deposition conditions, to at least one of the vaporized precursor, the at least one vaporized co-reactant precursor, or any combination thereof, to selectively deposit a silicon-containing film on the substrate. The substrate may comprise any of the substrates disclosed herein. In some embodiments, the exposing comprises contacting at least one of the vaporized precursor, the at least one vaporized co-reactant precursor, or any combination thereof, with the substrate, under vapor deposition conditions, sufficient to form a silicon-containing film on a surface of the substrate. In some embodiments, the exposing proceeds in a presence of a catalyst. Non-limiting examples of catalysts include, for example and without limitation, catalysts comprising at least one of aluminum, aluminum oxide, hafnium, hafnium oxide, zirconium, zirconium oxide, dimethyl aluminum isopropoxide, among others. In some embodiments, the exposing comprises contacting a first surface portion and a second surface portion of a substrate with the vaporized precursor in a presence of a catalyst. In some embodiments, the silicon-containing film is formed on the first surface portion of the substrate. In some embodiments, the silicon-containing film is formed on the first surface portion of the substrate, without depositing the silicon-containing film on the second surface portion of the substrate. In some embodiments, the catalyst covers a first surface portion of the substrate and is absent from a second surface portion of the substrate. In some embodiments, the first surface portion and the second surface portion are different.

The exposing may be performed in any system, apparatus, device, assembly, chamber thereof, or component thereof suitable for vapor deposition processes, including, for example and without limitation, a deposition chamber, among others. The substrate may be exposed to the vaporized precursor and the at least one co-reactant precursor at the same time or at different times. For example, each of the vaporized precursor, the at least one vaporized co-reactant precursor, and the substrate may be present in the deposition chamber at the same time. That is, in some embodiments, the exposing may comprise contemporaneous exposing or simultaneous exposing of the substrate to the vaporized precursor and the at least one vaporized co-reactant precursor. Alternatively, each of the vaporized precursor and the at least one vaporized co-reactant precursor may be present in the deposition chamber at different times. That is, in some embodiments, the exposing may comprise alternate and/or sequential exposing, in one or more cycles, of the vaporized precursor with the substrate and subsequently exposing the at least one vaporized co-reactant precursor with the substrate.

The vapor deposition conditions may comprise conditions for vapor deposition processes. Examples of vapor deposition conditions include, without limitation, vapor deposition conditions for vapor deposition processes including at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

The vapor deposition conditions may comprise, consist of, or consist essentially of a deposition temperature. The deposition temperature may be a temperature less than the thermal decomposition temperature of at least one of the vaporized precursor, the at least one vaporized co-reactant precursor, or any combination thereof. The deposition temperature may be sufficiently high to reduce or avoid condensation of at least one of the vaporized precursor, the at least one vaporized co-reactant precursor, or any combination thereof. In some embodiments, the substrate may be heated to the deposition temperature. In some embodiments, the chamber or other vessel in which the substrate is contacted with the vaporized precursor and the at least one vaporized co-reactant precursor is heated to the deposition temperature. In some embodiments, at least one of the vaporized precursor, the at least one vaporized co-reactant precursor, or any combination thereof may be heated to the deposition temperature.

The deposition temperature may be a temperature of 50° C. to 500° C. In some embodiments, the deposition temperature may be a temperature of 50° C. to 500° C. For example, in some embodiments, the deposition temperature may be a temperature of 50° C. to 500° C., 50° C. to 450° C., 50° C. to 400° C., 50° C. to 350° C., 50° C. to 300° C., 50° C. to 250° C., 50° C. to 200° C., 50° C. to 150° C., 50° C. to 100° C., 100° C. to 500° C., 150° C. to 500° C., 200° C. to 500° C., 250° C. to 500° C., 300° C. to 500° C., 350° C. to 500° C., 400° C. to 500° C., or 450° C. to 500° C.

The vapor deposition conditions may comprise, consist of, or consist essentially of a deposition pressure. In some embodiments, the deposition pressure may comprise, consist of, or consist essentially of a vapor pressure of at least one of the vaporized precursor, the at least one vaporized co-reactant precursor, or any combination thereof. In some embodiments, the deposition pressure may comprise, consist of, or consist essentially of a chamber pressure.

The deposition pressure may be a pressure of 0.001 Torr to 100 Torr. For example, in some embodiments, the deposition pressure may be a pressure of 0.001 Torr to 10 Torr, 0.01 Torr to 10 Torr, 0.1 Torr to 1 Torr, 1 Torr to 30 Torr, 1 Torr to 25 Torr, 1 Torr to 20 Torr, 1 Torr to 15 Torr, 1 Torr to 10 Torr, 5 Torr to 50 Torr, 5 Torr to 40 Torr, 5 Torr to 30 Torr, 5 Torr to 20 Torr, or 5 Torr to 15 Torr. In other embodiments, the deposition pressure may be a pressure of 1 Torr to 100 Torr, 5 Torr to 100 Torr, 10 Torr to 100 Torr, 15 Torr to 100 Torr, 20 Torr to 100 Torr, 25 Torr to 100 Torr, 30 Torr to 100 Torr, 35 Torr to 100 Torr, 40 Torr to 100 Torr, 45 Torr to 100 Torr, 50 Torr to 100 Torr, 55 Torr to 100 Torr, 60 Torr to 100 Torr, 65 Torr to 100 Torr, 70 Torr to 100 Torr, 75 Torr to 100 Torr, 80 Torr to 100 Torr, 85 Torr to 100 Torr, 90 Torr to 100 Torr, 95 Torr to 100 Torr, 1 Torr to 95 Torr, 1 Torr to 90 Torr, 1 Torr to 85 Torr, 1 Torr to 80 Torr, 1 Torr to 75 Torr, or 1 Torr to 70 Torr. In other further embodiments, the deposition pressure may be a pressure of 1 m Torr to 100 mTorr, 1 mTorr to 90 mTorr, 1 mTorr to 80 mTorr, 1 mTorr to 70 mTorr, 1 mTorr to 60 mTorr, 1 mTorr to 50 mTorr, 1 mTorr to 40 mTorr, 1 mTorr to 30 mTorr, 1 mTorr to 20 mTorr, 1 mTorr to 10 mTorr, 100 m Torr to 300 mTorr, 150 mTorr to 300 mTorr, 200 mTorr to 300 mTorr, or 150 mTorr to 250 mTorr, or 150 mTorr to 225 mTorr.

Some embodiments relate to a silicon-containing film on a surface of a substrate. In some embodiments, the silicon-containing film comprises any film formed according to the methods disclosed herein. In some embodiments, the silicon-containing film comprises any film prepared from the precursors disclosed herein.

Example 1

A 300 mm silicon oxide substrate is loaded into a CVD/ALD chamber and heated to 150° C. in flowing Ar controlled to 500 sccm with the pressure controlled to 1 Torr using a throttle valve. The substrate is first exposed to a 0.5 s dose of 50 sccm $H_2O$ vapor added to the Ar flow. The substrate is then purged with continued Ar flow for 5 s. Then a 3 s pulse of 20 sccm DMAI (dimethylaluminumisopropoxide) vapor. The substrate is then purged with continued Ar flow for 5 s. Then a 300 s pulse of 20 sccm of 1,1-Bis(1,1-dimethylethoxy)-1-ethenylsilanol vapor will deposit 50 Å of low k (k<3.9) SiOCH film. The substrate is then purged with continued Ar flow for 500 s. If additional thickness is desired, the DMAI and 1,1-Bis(1,1-dimethylethoxy)-1-ethenylsilanol vapor pulses can be repeated until the desired thickness is reached.

Example 2

A 300 mm substrate with some areas of OH-terminated dielectric and some areas of $CH_3$-terminated metal is loaded into a CVD/ALD chamber and heated to 150° C. in flowing Ar controlled to 500 sccm with the pressure controlled to 1 Torr using a throttle valve. The substrate is first exposed to a 0.5 s dose of 50 sccm $H_2O$ vapor added to the Ar flow. The substrate is then purged with continued Ar flow for 5 s. Then a 3 s pulse of 20 sccm DMAI (dimethylaluminumisopropoxide) vapor. In this case the Al deposits only on the OH-terminated dielectric surface and the metal does not receive any of the catalyst. The substrate is then purged with continued Ar flow for 5 s. Then a 300 s pulse of 20 sccm of 1,1-Bis(1,1-dimethylethoxy)-1-ethenylsilanol vapor will deposit 50 Å of low k (k<3.9) SiOCH film only on the dielectric surface with no appreciable deposition on the metal surface. The substrate is then purged with continued Ar flow for 500 s. If additional thickness is desired, the DMAI and 1,1-Bis(1,1-dimethylethoxy)-1-ethenylsilanol vapor pulses can be repeated until the desired thickness is reached.

ASPECTS

Various Aspects are described below. It is to be understood that any one or more of the features recited in the following Aspect(s) can be combined with any one or more other Aspect(s).

Aspect 1. A precursor comprising:

a compound of the formula:

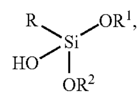

where:

R is an alkyl, an alkenyl, or an alkoxy; and $R^1$ and $R^2$ are independently a hydrogen, an alkyl, or $R^1$ and $R^2$ are bonded to form a heterocycle;

wherein R is different from at least one of $OR^1$, $OR^2$, or any combination thereof;

wherein the compound, when vaporized to form a precursor vapor, is deposited on a material having a dielectric constant of no greater than 3.9.

Aspect 2. The precursor according to Aspect 1, wherein R is a vinyl, an allyl, or an alkoxy.

Aspect 3. The precursor o according to any one of Aspects 1-2, wherein R is a vinyl, an allyl, a tert-butoxy, or a tert-pentoxy.

Aspect 4. The precursor according to any one of Aspects 1-3, wherein $R^1$ and $R^2$ are a tert-pentyl.

Aspect 5. The precursor according to any one of Aspects 1-4, wherein $R^1$ and $R^2$ are tert-butyl.

Aspect 6. The precursor according to any one of Aspects 1-5, wherein $R^1$ and $R^2$ are bonded to form a 5-membered heterocycle.

Aspect 7. The precursor according to any one of Aspects 1-6, wherein the precursor comprises a compound of the formula:

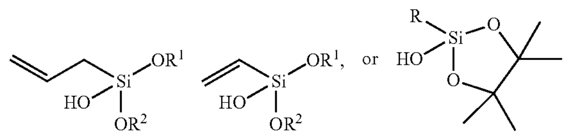

where:

$R^1$ and $R^2$ are independently a hydrogen, an alkyl, or $R^1$ and $R^2$ are bonded to form a heterocycle.

Aspect 8. The precursor according to any one of Aspects 1-7, wherein the precursor comprises a compound of the formula:

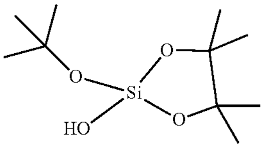

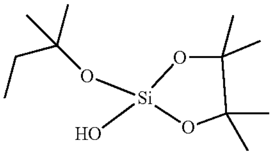

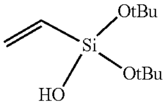

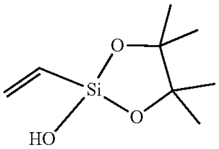

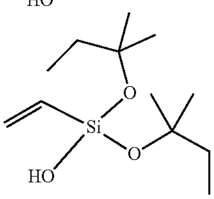

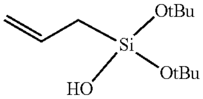

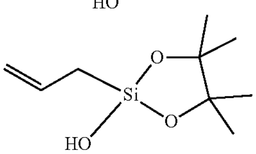

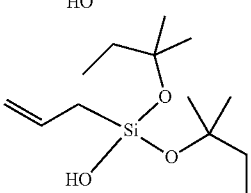
.

Aspect 9. A device comprising:

a substrate having a first surface portion and a second surface portion; and a silicon-containing film located on the first surface portion of the substrate, wherein the silicon-containing film comprises a reaction product of at least a precursor and a reactive group on the first surface portion of the substrate, wherein the precursor comprises a compound of the formula:

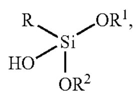

where:

R is an alkyl, an alkenyl, or an alkoxy; and $R^1$ and $R^2$ are independently a hydrogen, an alkyl, or $R^1$ and $R^2$ are bonded to form a heterocycle;

wherein R is different from at least one of $OR^1$, $OR^2$, or any combination thereof wherein the second surface portion of the substrate does not comprise the silicon-containing film.

Aspect 10. The device according to Aspect 9, wherein the first surface portion of the substrate comprises at least one of a dielectric material, an insulating material, or any combination thereof.

Aspect 11. The device according to any one of aspects 9-10, wherein the first surface portion of the substrate comprises at least one of $SiO_2$, SiN, or any combination thereof.

Aspect 12. The device according to any one of aspects 9-11, wherein the first surface portion of the substrate comprises a material having a dielectric constant of 3.9 or less; and wherein the second surface portion of the substrate comprises a material having a dielectric constant of greater than 3.9.

Aspect 13. The device according to any one of aspects 9-12, wherein the silicon-containing film has a thickness of 20 Å to 100 μm.

Aspect 14. The device according to any one of aspects 9-13, wherein the silicon-containing film comprises $SiO_2$.

Aspect 15. The device according to any one of aspects 9-14, wherein the silicon-containing film comprises SiCOH.

Aspect 16. The device according to any one of aspects 9-15, wherein the device is a self-aligned via.

Aspect 17. A method comprising:

obtaining a precursor, wherein the precursor is a compound of the formula:

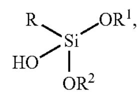

where:

R is an alkyl, an alkenyl, or an alkoxy; and $R^1$ and $R^2$ are independently a hydrogen, an alkyl, or $R^1$ and $R^2$ are bonded to form a heterocycle;

wherein R is different from at least one of $OR^1$, $OR^2$, or any combination thereof;

vaporizing the precursor to produce a vaporized precursor; and exposing a substrate to the vaporized precursor in a presence of a catalyst to selectively deposit a silicon-containing film on the substrate.

Aspect 18. The method according to Aspect 17, wherein the method does not comprise an etching step.

Aspect 19. The method according to any one of Aspects 17-18, wherein the catalyst comprises at least one of an aluminum oxide, a hafnium oxide, a zirconium oxide, or any combination thereof.

Aspect 20. The method according to any one of Aspects 17-19, wherein the catalyst covers a first surface portion of the substrate and is absent from a second surface portion of the substrate.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A precursor comprising:

a compound of the formula:

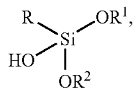

where:

R is an alkyl, an alkenyl, or an alkoxy; and $R^1$ and $R^2$ are independently an alkyl, or $R^1$ and $R^2$ are bonded to form a heterocycle;

wherein R is different from at least one of $OR^1$, $OR^2$, or any combination thereof.

2. The precursor of claim 1, wherein R is a vinyl, an allyl, or an alkoxy.

3. The precursor of claim 1, wherein R is a vinyl, an allyl, a tert-butoxy, or a tert-pentoxy.

4. The precursor of claim 1, wherein $R^1$ and $R^2$ are a tert-pentyl.

5. The precursor of claim 1, wherein $R^1$ and $R^2$ are tert-butyl.

6. The precursor of claim 1, wherein $R^1$ and $R^2$ are bonded to form a 5-membered heterocycle.

7. The precursor of claim 1, wherein the precursor comprises a compound of the formula:

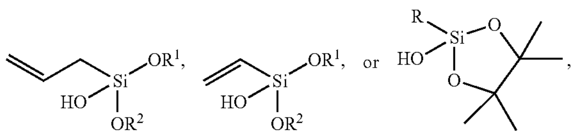

where:

$R^1$ and $R^2$ are independently an alkyl, or $R^1$ and $R^2$ are bonded to form a heterocycle.

8. The precursor of claim 1, wherein the precursor comprises a compound of the formula:

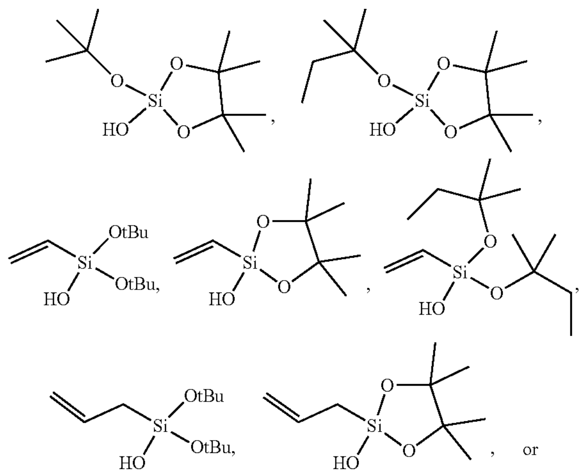

-continued

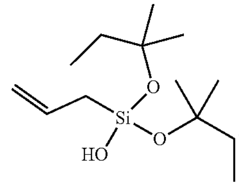

9. A device comprising:

a substrate having a first surface portion and a second surface portion; and a silicon-containing film located on the first surface portion of the substrate, wherein the silicon-containing film comprises a reaction product of at least a precursor and a reactive group on the first surface portion of the substrate, wherein the precursor comprises a compound of claim 1

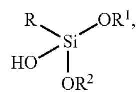

wherein the second surface portion of the substrate does not comprise the silicon-containing film.

10. The device of claim 9, wherein the first surface portion of the substrate comprises at least one of a dielectric material, an insulating material, or any combination thereof.

11. The device of claim 9, wherein the first surface portion of the substrate comprises at least one of $SiO_2$, SiN, or any combination thereof.

12. The device of claim 9, wherein the first surface portion of the substrate comprises a material having a dielectric constant of 3.9 or less; wherein the second surface portion of the substrate comprises a material having a dielectric constant of greater than 3.9.

13. The device of claim 9, wherein the silicon-containing film has a thickness of 20 Å to 100 μm.

14. The device of claim 9, wherein the silicon-containing film comprises $SiO_2$.

15. The device of claim 9, wherein the silicon-containing film comprises SiCOH.

16. The device of claim 9, wherein the device is a self-aligned via.

17. A method comprising:

obtaining a precursor of claim 1

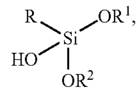

vaporizing the precursor to produce a vaporized precursor; and exposing a substrate to the vaporized precursor in a presence of a catalyst to selectively deposit a silicon-containing film on the substrate.

18. The method of claim 17, wherein the method does not comprise an etching step.

19. The method of claim 17, wherein the catalyst comprises at least one of an aluminum oxide, a hafnium oxide, a zirconium oxide, or any combination thereof.

20. The method of claim 17, wherein the catalyst covers a first surface portion of the substrate and is absent from a second surface portion of the substrate.

* * * * *